(12) United States Patent
Lin et al.

(10) Patent No.: US 10,571,073 B1
(45) Date of Patent: Feb. 25, 2020

(54) ADJUSTABLE STRAP AND HEAD MOUNTED DISPLAY DEVICE

(71) Applicant: HTC Corporation, Taoyuan (TW)

(72) Inventors: Sheng-Cherng Lin, Taoyuan (TW); Jui-Hsiang Lin, Taoyuan (TW)

(73) Assignee: HTC Corporation, Taoyuan (TW)

( * ) Notice: Subject to any disclaimer, the term of this patent is extended or adjusted under 35 U.S.C. 154(b) by 0 days.

(21) Appl. No.: 16/258,678

(22) Filed: Jan. 28, 2019

Related U.S. Application Data

(60) Provisional application No. 62/717,915, filed on Aug. 13, 2018.

(51) Int. Cl.
*F16M 13/04* (2006.01)
*H05K 5/02* (2006.01)
*H05K 5/00* (2006.01)

(52) U.S. Cl.
CPC ........... *F16M 13/04* (2013.01); *H05K 5/0017* (2013.01); *H05K 5/0217* (2013.01)

(58) Field of Classification Search
CPC .... A42B 3/145; G02B 27/0176; F16M 13/04; H05K 5/0017; H05K 5/0217
See application file for complete search history.

(56) References Cited

U.S. PATENT DOCUMENTS 5,373,588 A * 12/1994 Hede ...................... A42B 3/145
2/418
6,515,853 B2 * 2/2003 Saito ...................... G06F 1/163
349/58

(Continued)

FOREIGN PATENT DOCUMENTS

| CN | 207011779 | 2/2018 |
|---|---|---|
| TW | 327730 | 3/1998 |
| WO | 2004010808 | 2/2004 |

OTHER PUBLICATIONS

"PEZ Reviews: Saris T-Bones Bike Rack", retrieved from https://www.pezcyclingnews.com/technspec/pez-reviews-saris-t-bones-bike-rack-2/.

(Continued)

*Primary Examiner* — Corey N Skurdal
(74) *Attorney, Agent, or Firm* — JCIPRNET

(57) ABSTRACT

An adjustable strap and a head mounted display device are provided. The adjustable strap includes a body, a sliding member, a limiting member, and an engaging member. The body has a slot section and a control section. The slot section has a slot and an engaging portion. The control section has a through hole. The slot section and the control section overlap. The sliding member and the limiting member pass through the slot and the through hole for connection. The engaging member and the control section pass through the slot for fixed connection. The sliding member and the limiting member are configured to slide between a first end and a second end of the through hole. When the sliding member and the limiting member are at the first end, the limiting member restricts an engaging end of the engaging member to be away from the engaging portion, such that the slot section and the control section are relatively slidable. When the sliding member and the limiting member are at the second end, the limiting member releases restriction of the engaging end, such that the engaging end engages the engaging portion to restrict relative sliding between the slot section and the control section.

14 Claims, 9 Drawing Sheets

(56) References Cited

U.S. PATENT DOCUMENTS

| | | | | |
|---|---|---|---|---|
| 7,000,262 | B2* | 2/2006 | Bielefeld | A42B 3/145 2/418 |
| 7,480,133 | B2* | 1/2009 | Nakabayashi | G02B 27/0176 2/422 |
| 9,557,569 | B2* | 1/2017 | Tazbaz | G02B 27/0179 |
| 2004/0003453 | A1* | 1/2004 | Urakawa | G02B 27/0176 2/422 |
| 2008/0109947 | A1* | 5/2008 | Dubois | A42B 3/145 2/414 |
| 2009/0320187 | A1 | 12/2009 | Petzl et al. | |
| 2017/0337737 | A1* | 11/2017 | Edwards | F16M 13/04 |
| 2018/0027676 | A1* | 1/2018 | Araki | G02B 27/0176 361/679.01 |
| 2018/0364490 | A1* | 12/2018 | Lin | A42B 1/245 |
| 2019/0037715 | A1* | 1/2019 | Chen | H05K 5/0017 |

OTHER PUBLICATIONS

"Office Action of Taiwan Counterpart Application," dated Nov. 1, 2019, p. 1-p. 3.

* cited by examiner

ADJUSTABLE STRAP AND HEAD MOUNTED DISPLAY DEVICE

CROSS-REFERENCE TO RELATED APPLICATION

This application claims the priority benefit of U.S. provisional application Ser. No. 62/717,915, filed on Aug. 13, 2018. The entirety of the above-mentioned patent application is hereby incorporated by reference herein and made a part of this specification.

BACKGROUND

Technical Field

The application relates to a strap and a display device, and more particularly, the application relates to an adjustable strap and a head mounted display device featuring the adjustable strap.

Description of Related Art

In recent years, applications of virtual reality (VR) become more and more popular. Generally, a user usually fixes a head mounted display (HMD) onto the head through a strap. In order to allow users to easily tighten and release the straps, it is observed that complicated mechanical design is adopted at present, and as such, a large number of parts are required, costs are raised, and assembly difficulty is increased. Therefore, how to fix a head mounted display device onto a user's head through a simple and convenient manner and reduce costs at the same time is an important issue.

SUMMARY

The application provides an adjustable strap which allows a user to make adjustment easily and quickly.

An adjustable strap of the application includes a body, a sliding member, a limiting member, and an engaging member. Two opposite sides of the body are a slot section and a control section, and the slot section has a slot and an engaging portion. The slot extends in a length direction of the slot section. The engaging portion is located at lateral sides of the slot. The control section has a through hole. The body circles around to enable the slot section and the control section to overlap. The sliding member and the limiting member pass through the slot and the through hole for connection. The slot section and the control section are sandwiched between the sliding member and the limiting member. The engaging member and the control section pass through the slot for fixed connection, and the sliding member and the limiting member are configured to slide between a first end and a second end opposite to each other of the through hole. The first end is farther away from the engaging member fixedly connected to the control section than the second end. When the sliding member and the limiting member are at the first end, the limiting member restricts an engaging end of the engaging member to be away from the engaging portion, such that the slot section and the control section are relatively slidable freely. When the sliding member and the limiting member are at the second end, the limiting member releases restriction of the engaging end, such that the engaging end engages the engaging portion to restrict relative sliding between the slot section and the control section.

A head mounted display device of the application includes a display portion and an adjustable strap. The adjustable strap is connected to the display portion. The adjustable strap includes a body, a sliding member, a limiting member, and an engaging member. Two opposite sides of the body are a slot section and a control section, and the slot section has a slot and an engaging portion. The slot extends in a length direction of the slot section. The engaging portion is located at lateral sides of the slot. The control section has a through hole. The body circles around to enable the slot section and the control section to overlap. The sliding member and the limiting member pass through the slot and the through hole for connection. The slot section and the control section are sandwiched between the sliding member and the limiting member. The engaging member and the control section pass through the slot for fixed connection, and the sliding member and the limiting member are configured to slide between a first end and a second end opposite to each other of the through hole. The first end is farther away from the engaging member fixedly connected to the control section than the second end. When the sliding member and the limiting member are at the first end, the limiting member restricts an engaging end of the engaging member to be away from the engaging portion, such that the slot section and the control section are relatively slidable freely. When the sliding member and the limiting member are at the second end, the limiting member releases restriction of the engaging end, such that the engaging end engages the engaging portion to restrict relative sliding between the slot section and the control section.

To sum up, in the adjustable strap and the head mounted display device of the application, since the slot section and the control section are located at the two opposite sides of the body, the total number of parts of the application is accordingly reduced and costs are further lowered. In addition, as the through hole is formed on the control section and the sliding member and the limiting member can slide between the first end and the second end of the through hole, the engaging ends are further driven to be away from or propped against the engaging portion, so that the slot section and the control section are controlled to relatively slide, and the body is therefore adjusted. The structural design between the slot section and the control section allow the user only has to push the sliding member along the slot when using the adjustable strap provided by the application, and that adjustment and locking are completed at the same time, and convenient using experience is thus provided.

To make the aforementioned more comprehensible, several embodiments accompanied with drawings are described in detail as follows.

DESCRIPTION OF THE EMBODIMENTS

Figure 1:
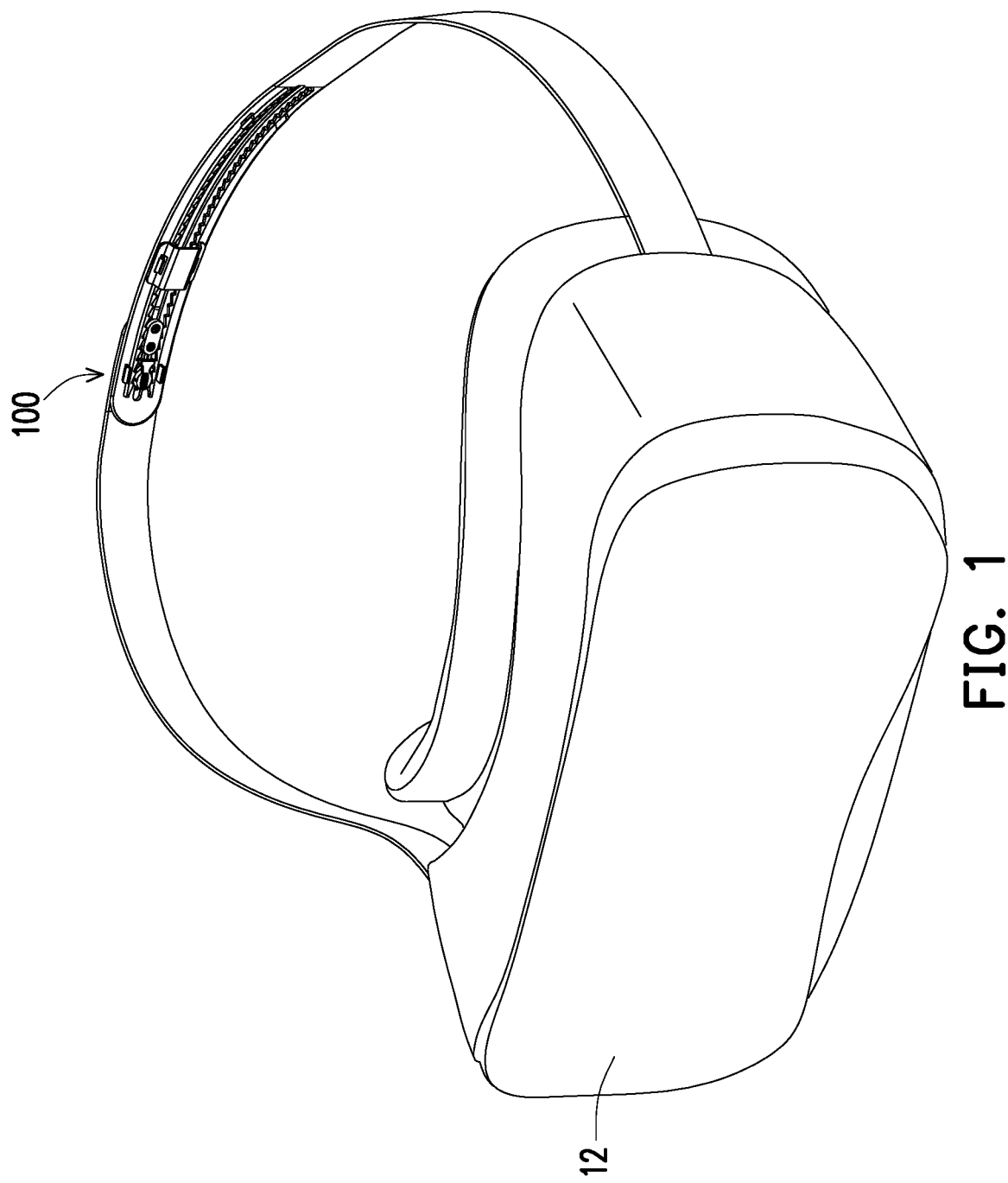
FIG. 1 illustrates a head mounted display device according to an embodiment of the invention.
Figure 2:
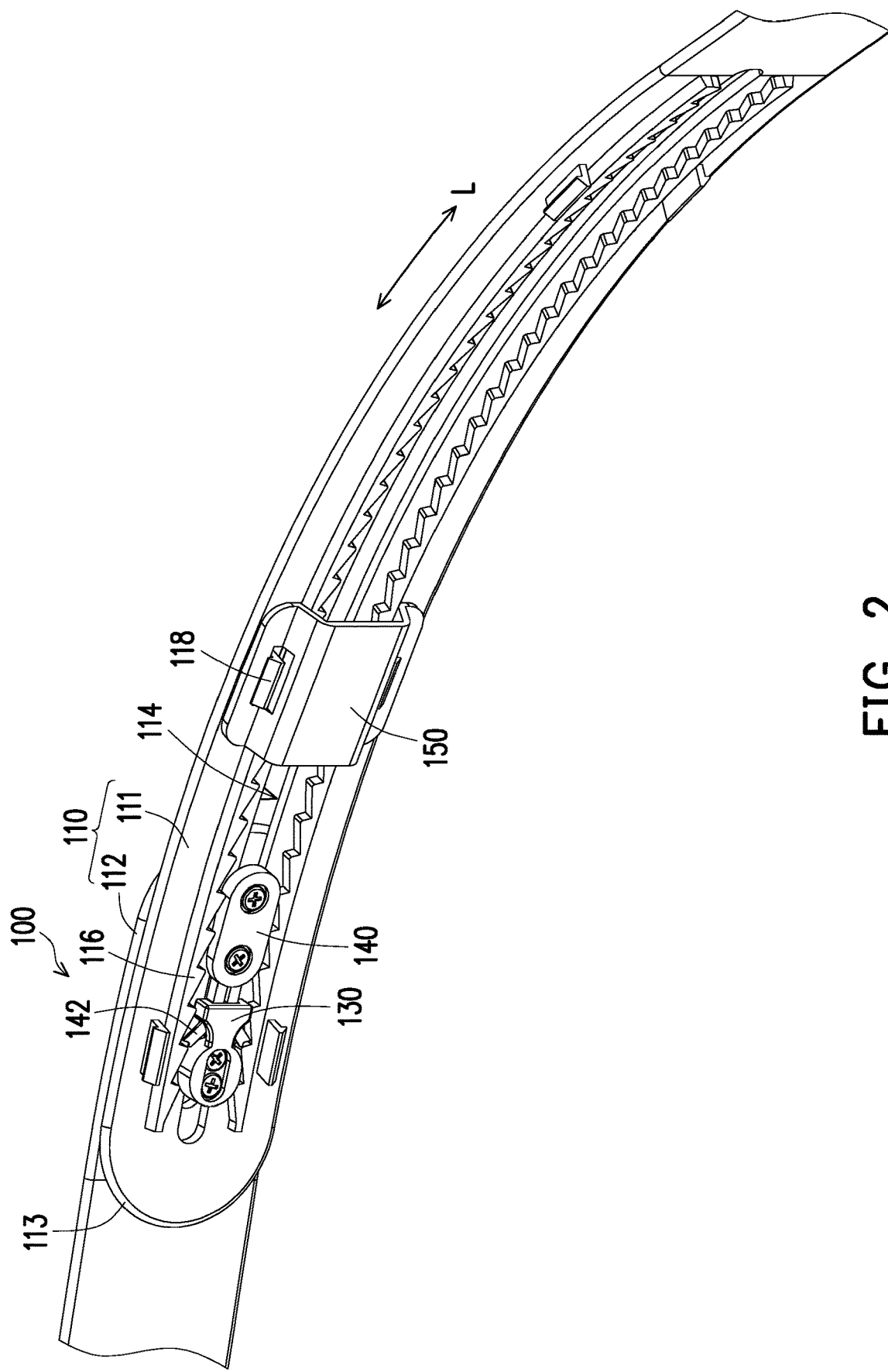
FIG. 2 is a schematic local view of an adjustable strap of FIG. 1.
Figure 3:
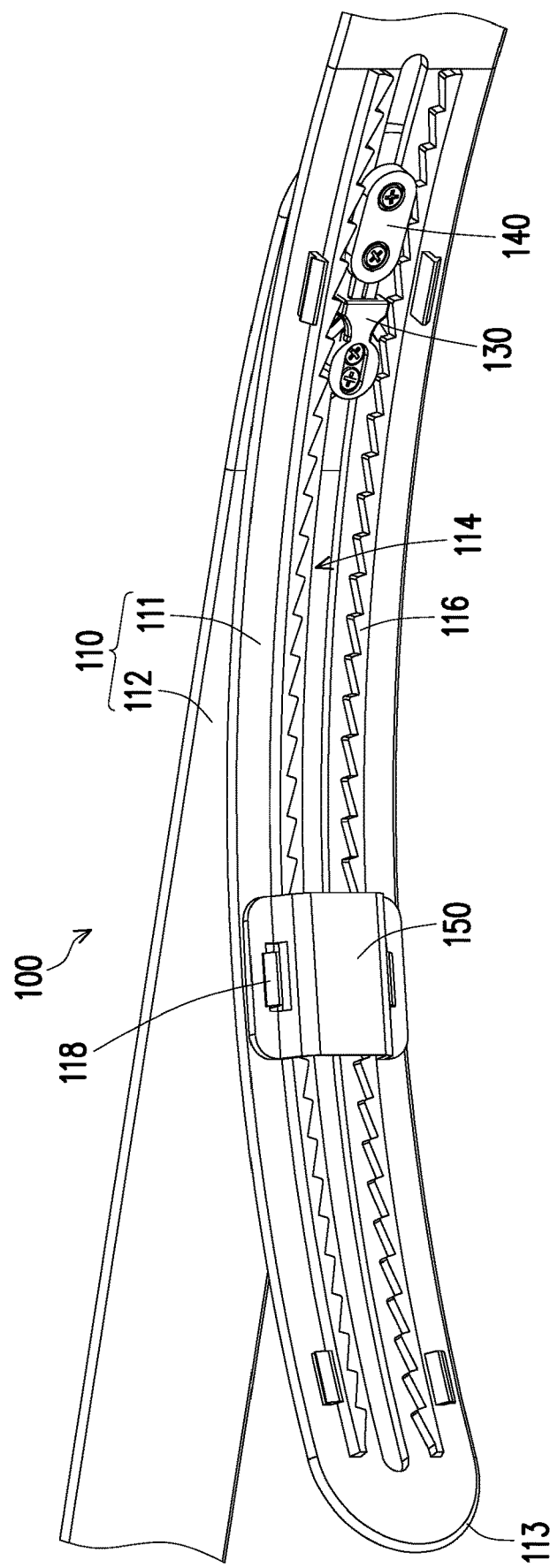
FIG. 3 is a schematic local view of relative sliding between a slot section and a control section of FIG. 2.
Figure 4:
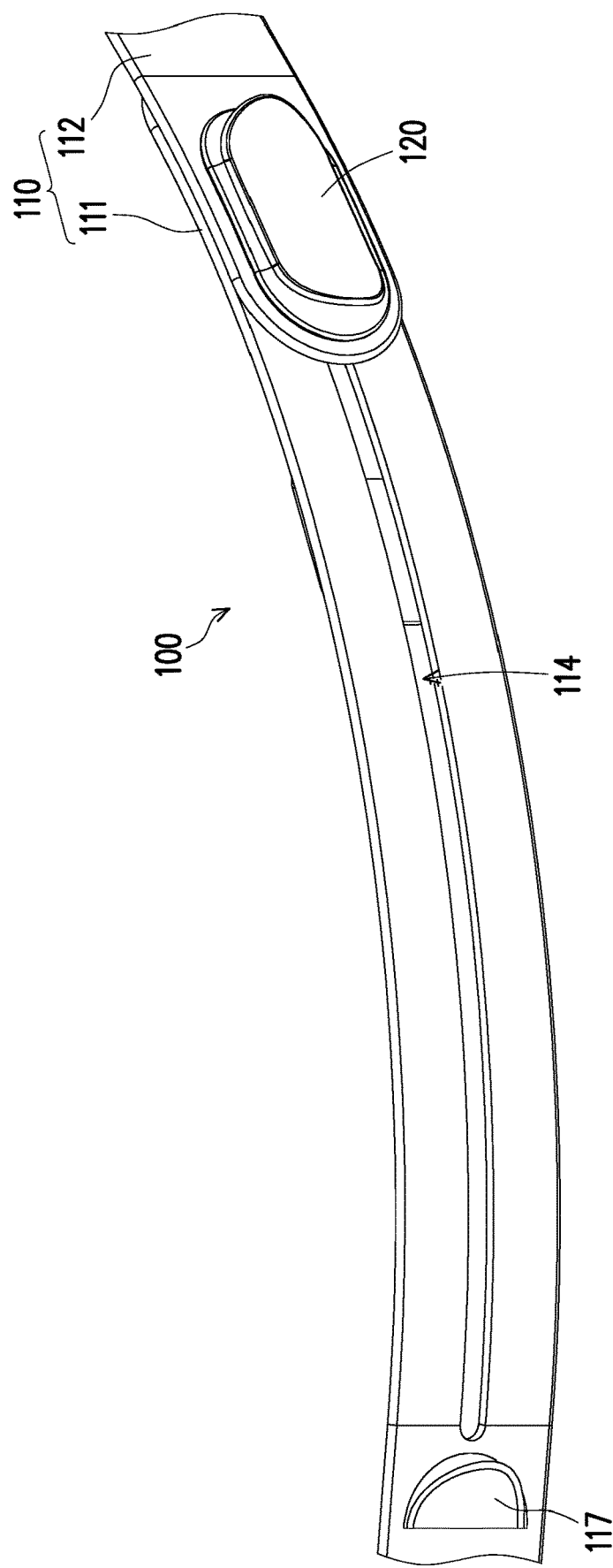
FIG. 4 is a schematic local view of the adjustable strap of FIG. 2 from another viewing angle.

FIG. 1 illustrates a head mounted display device according to an embodiment of the invention. FIG. 2 is a schematic local view of an adjustable strap of FIG. 1. FIG. 3 is a schematic local view of relative sliding between a slot section and a control section of FIG. 2. FIG. 4 is a schematic local view of the adjustable strap of FIG. 2 from another viewing angle. With reference to FIG. 1 to FIG. 4, a head mounted display device 10 of this embodiment includes a display portion 12 and an adjustable strap 100 connected to the display portion 12. It is worth noting that the adjustable strap 100 of this embodiment may also be applied on a shoe, a safety helmet, a helmet, or other devices so that tightness can be conveniently adjusted.

In this embodiment, the adjustable strap 100 includes a body 110, a sliding member 120, a limiting member 130, and an engaging member 140. Two sides of the body 110 are a slot section 111 and a control section 112, and the body 110 circles around to enable a portion of the slot section 111 and a portion of the control section 112 to overlap. For instance, the slot section 111 and the control section 112 of the body 110 are connected by a middle section (not labeled), and the display portion 12 is connected to the middle section. The slot section 111 has a slot 114 and an engaging portion 116. The slot 114 extends in a length direction L of the slot section 111. The engaging portion 116 is located at lateral sides of the slot 114. In this embodiment, the engaging portion 116 is located at two lateral sides of the slot 114, but the engaging portion 116 may also be located only at one single lateral side of the slot 114, and the application is not limited thereto. The control section 112 has a through hole 115 (shown in FIG. 6A). The sliding member 120 and the limiting member 130 pass through the slot 114 and the through hole 115 for connection. The slot section 111 and the control section 112 are sandwiched between the sliding member 120 and the limiting member 130. The engaging member 140 and the control section 112 pass through the slot 114 for fixed connection.

Figure 5A:
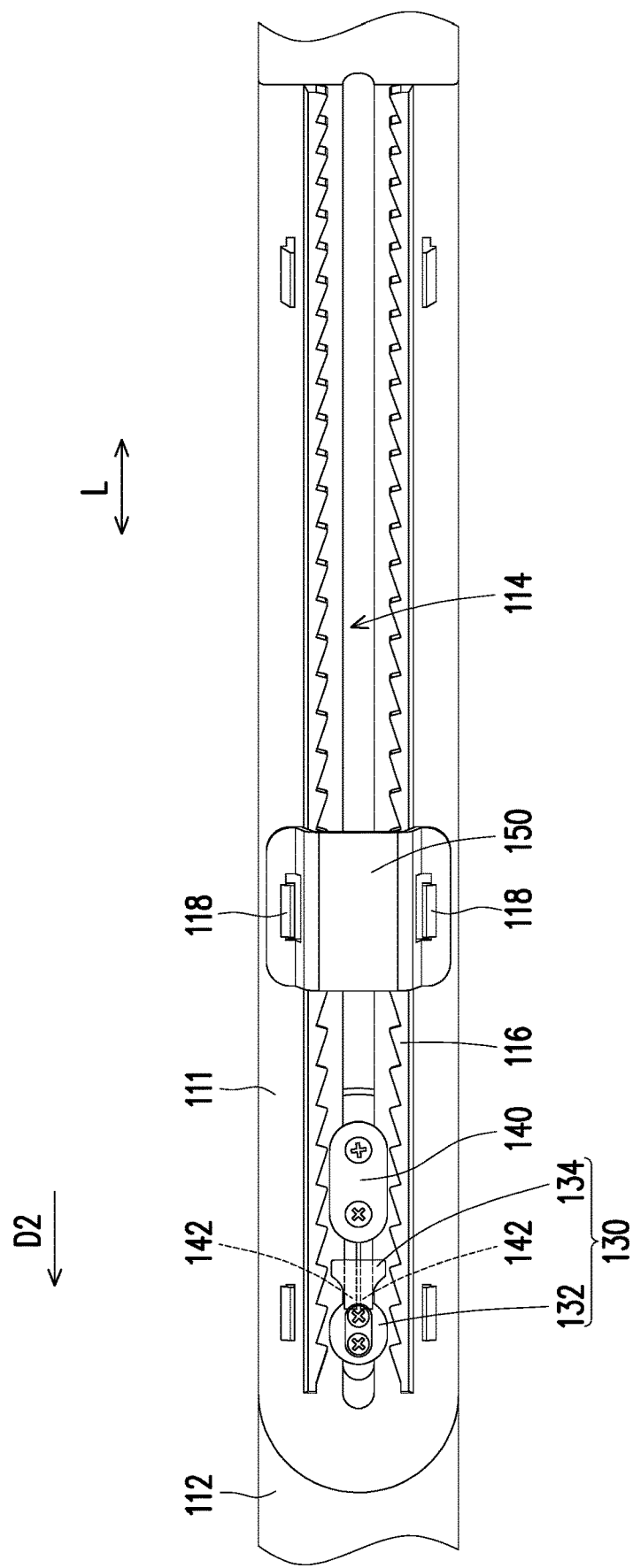
FIG. 5A is a schematic local view of engaging ends of FIG. 2 being away from an engaging portion.
Figure 5B:
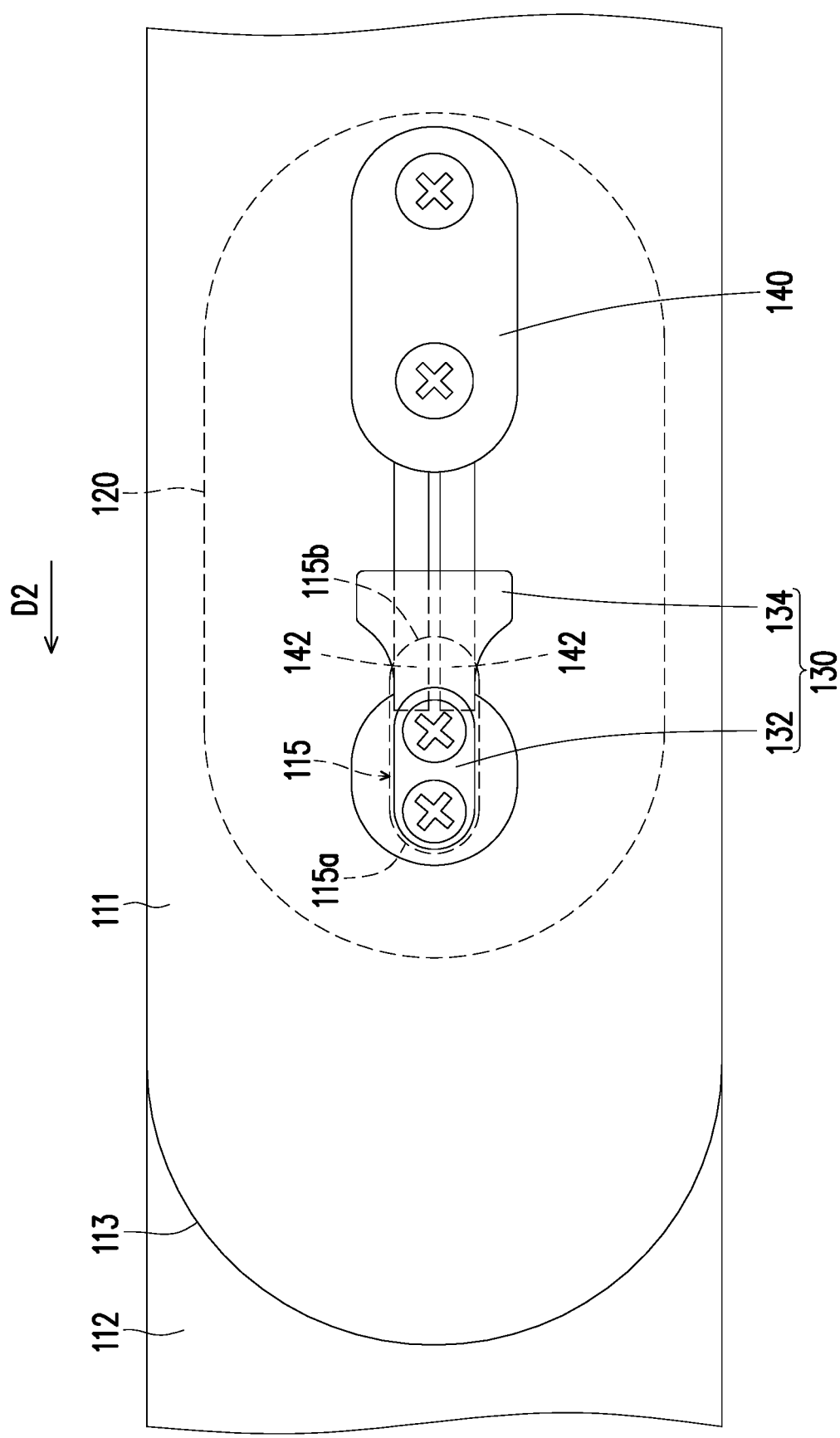
FIG. 5B is a schematic local enlargement view of FIG. 5A.
Figure 6A:
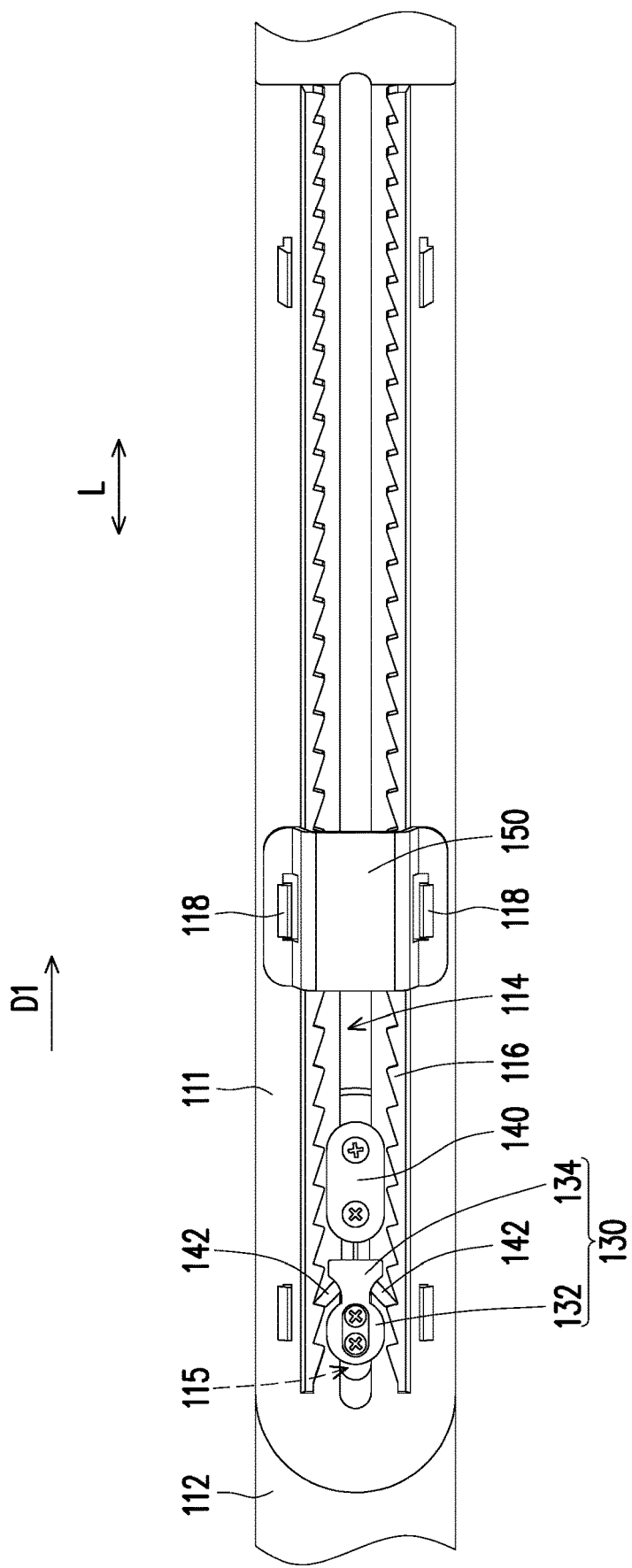
FIG. 6A is a schematic local view of the engaging ends of FIG. 5A engaging with the engaging portion.
Figure 6B:
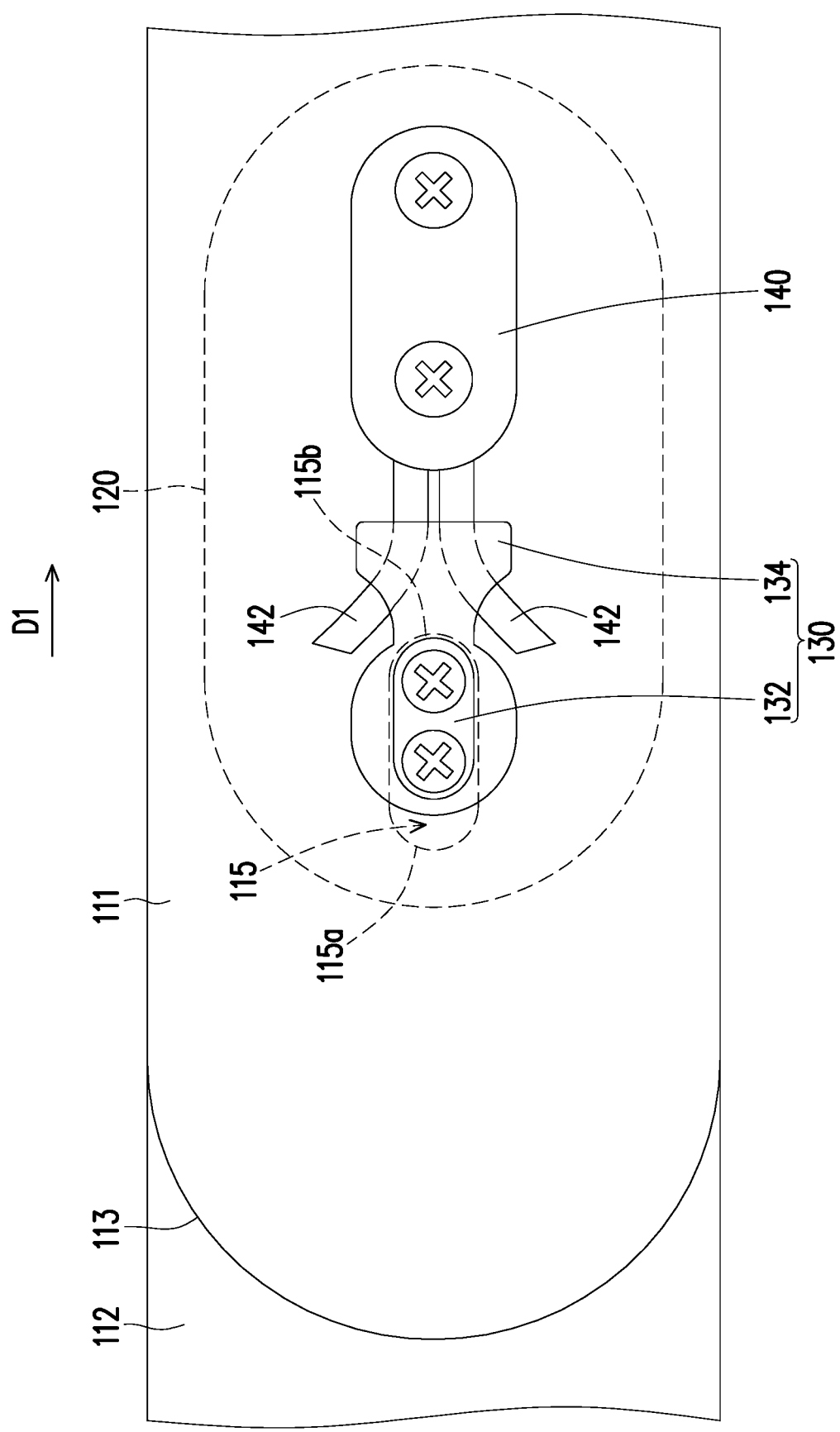
FIG. 6B is a schematic local enlargement view of FIG. 6A.

FIG. 5A is a schematic local view of engaging ends of FIG. 2 being away from an engaging portion. FIG. 5B is a schematic local enlargement view of FIG. 5A. FIG. 6A is a schematic local view of the engaging ends of FIG. 5A engaging with the engaging portion. FIG. 6B is a schematic local enlargement view of FIG. 6A. It is worth noting that in order to allow the drawings to be easily understood, the engaging portion 116 is omitted in FIG. 5B and FIG. 6B. With reference to FIG. 5A, FIG. 5B, FIG. 6A, and FIG. 6B, the limiting member 130 includes a sliding portion 132 and a limiting portion 134 connected to the sliding portion 132. In this embodiment, it is the sliding portion 132 of the limiting member 130 which passes through the slot 114 and the through hole 115 to be connected to the sliding member 120, but it may also be a portion of the sliding member 120 which passes through the slot 114 and the through hole 115 to be connected to the limiting member 130, and the application is not limited thereto. Specifically, since a size of the through hole 115 in the length direction L is slightly greater than that of the sliding portion 132, the sliding member 120 and the limiting member 130 may relatively side between a first end 115a and a second end 115b opposite to each other of the through hole 115. The first end 115a is farther away from the engaging member 140 fixedly connected to the control section 112 than the second end 115b.

As shown in FIG. 5A and FIG. 5B, when the sliding member 120 and the limiting member 130 are at the first end 115a, the limiting member 130 restricts engaging ends 142 of the engaging member 140 to be away from the engaging portion 116, such that the slot section 111 and the control section 112 are relatively slidable freely, so that tightness applied by the body 110 to the head of a user may be adjusted. As shown in FIG. 6A and FIG. 6B, when the sliding member 120 and the limiting member 130 are at the second end 115b, the limiting portion 134 of the limiting member 130 releases restriction of the engaging ends 142, such that the engaging ends 142 engages with the engaging portion 116 to restrict relative sliding between the slot section 111 and the control section 112, and fixing is thereby achieved.

Figure 7:
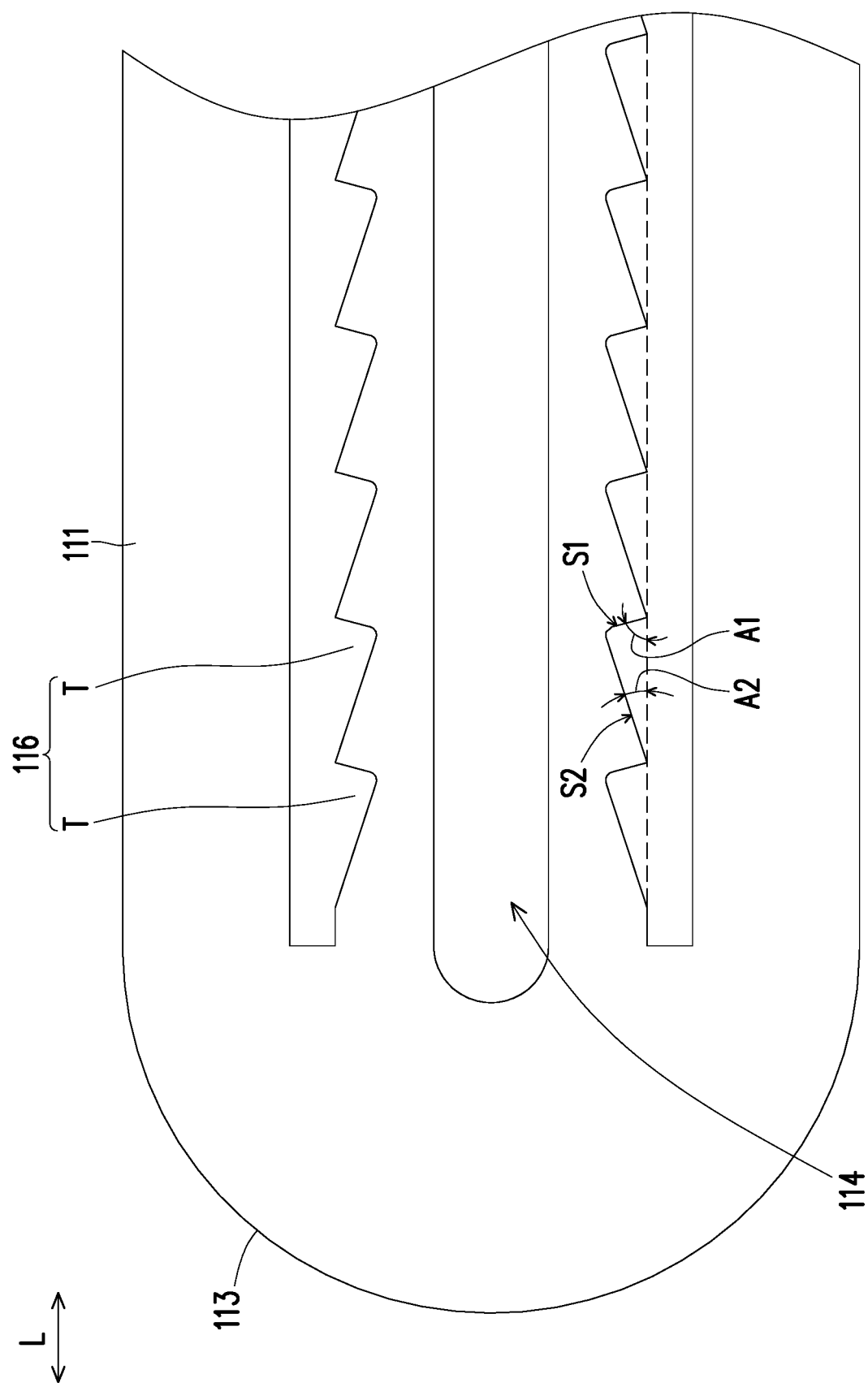
FIG. 7 is a schematic local enlargement view of a tail end of the slot section of FIG. 3.

FIG. 7 is a schematic local enlargement view of a tail end of the slot section of FIG. 3. It is worth noting that in order to allow the drawings to be easily understood, FIG. 7 illustrates only the components which are related to the structure of the engaging portion 116. With reference to FIG. 7, in this embodiment, the engaging portion 116 is, for example, a rack, but the application is not intended to limit the type of the engaging portion 116. Specifically, the engaging portion 116 includes a plurality of triangular teeth T, and each of the triangular teeth T has a first inclined surface S1 and a second inclined surface S2. In each of the triangular teeth T, the second inclined surface S2 is closer to a tail end 113 of the slot section 111 than the first inclined surface S1. An included angle A1 between the first inclined surface S1 and the length direction L of the slot section 111 is between 60 degrees and 80 degrees, and preferably, the included angle A1 is 75 degrees. An included angle A2 between the second inclined surface S2 and the length direction L of the slot 114 is between 10 degrees and 30 degrees, and preferably, the included angle A2 is 18 degrees.

With reference to FIG. 6A and FIG. 6B again, when the adjustable strap 100 is tightened, the user pushes the sliding member 120 in the length direction L toward a first direction (i.e., the right side of FIG. 6A) D1, so that the limiting member 130 linked up with the sliding member 120 drives the engaging member 140 to move towards the first direction D1. In this process, since the included angle A2 is designed to be a smaller angle, the user is required to apply a relatively less force only to allow the engaging ends 142 to be released from the first inclined surface S1 and to slide along the second inclined surface S2, and force-saving is thus achieved. After the body 110 is adjusted to apply the required tightness, the user stops pushing the sliding member 120, the sliding member 120 and the limiting member 130 move to the second end 115b of the through hole 115, an elastic restoring force of the engaging ends 142 enables the engaging ends 142 to approach the engaging portion 116 and be propped against the closest first inclined surface S1, and that the adjustment process is completed. At this time, the slot section 111 and the control section 112 are mutually locked. In a locked state, since the included angle A1 is designed to be greater than the included angle A2, the engaging ends 142 attached to the first inclined surface S1 are prevented from generating unnecessary sliding which may lead to detachment, so that fixation between the slot section 111 and the control section 112 is ensured. When the user stops pushing the sliding member 120, the engaging member 140 may be instantly engaged with the engaging portion 116 to achieve fast locking.

The following provides further description describing how the adjustable strap 100 of this embodiment is used. With reference to FIG. 5A and FIG. 5B again, when the adjustable strap 100 of this embodiment is to be loosened, the user pushes the sliding member 120 in the length direction L toward a second direction (i.e., the left side of FIG. 5A) D2, so that the limiting member 130 is driven to slide to the first end 115a of the through hole 115. The engaging ends 142 are forced to be deformed and thus are away from the engaging portion 116 at the same time when the limiting member 130 slides and are drawn back into the limiting portion 134 at last. Since the engaging ends 142 are detached from the engaging portion 116, the slot section 111 and the control section 112 may relatively slide freely. Since an engaging force between the engaging ends 142 and the engaging portion 116 is absent, the adjustable strap 100 is not subjected to a resistance force and may be loosened quickly. In this way, the user's demand for loosening the adjustable strap 100 easily is thereby satisfied. Compared to the prior art, additional pressing buttons, buckles, or other accessories for fixing are not required to be disposed on the adjustable strap 100 of this embodiment, so the number of parts is reduced and costs are thereby lowered.

As shown in FIG. 2 and FIG. 3, in this embodiment, the adjustable strap 100 further includes a crossover connection member 150. The slot section 111 form hooks 118 at the two sides of the slot 114. The crossover connection member 150 crosses the two sides of the slot section 111 and is engaged with the hooks 118, so as to prevent the limiting member 130 and the engaging member 140 from being detached from the control section 112, so that the limiting member 130 and the engaging member 140 are ensured to be secured in a direction perpendicular to the length direction L. In addition, the crossover connection member 150 may also prevent the slot section 111 at the two sides of the slot 114 to be separated. In this embodiment, a number of the crossover connection member 150 is exemplified as one, and a number of the hooks 118 is exemplified as three, but the application is not limited thereto.

With reference to FIG. 2 and FIG. 4 together, in this embodiment, the control section 112 has a stopping portion 117 located next to one end of the slot 114 away from the tail end 113 of the slot section 111 and configured to be in contact with a tail end of the control section 112 to stop the control section 112. When the adjustable strap 100 of this embodiment is adjusted, as the stopping portion 117 is disposed, the user is prevented from excessively pushing the sliding member 120 to be detached from the slot 114.

In view of the foregoing, in the adjustable strap and the head mounted display device of the application, since the slot section and the control section are located at the two opposite sides of the body and adjustment and fixation can be made without additional pressing buttons, buckles, or other accessories for fixing to be disposed, and thus, the total number of parts is reduced and costs are further lowered. In addition, as the through hole is formed on the control section and the sliding member and the limiting member can slide between the first end and the second end of the through hole, the engaging ends are further driven to be away from or propped against the engaging portion, so that the slot section and the control section are controlled to relatively slide, and the body is therefore adjusted. Through the structural design between the slot section and the control section, the user only has to push the sliding member along the slot when using the adjustable strap provided by the application, and that adjustment and locking are completed at the same time, and convenient using experience is thus provided.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. An adjustable strap, comprising:
a body, two opposite sides of the body being a slot section and a control section, wherein the slot section has a slot and an engaging portion, the slot extends in a length direction of the slot section, the engaging portion is located at lateral sides of the slot, and the control section has a through hole;
a sliding member;
a limiting member, wherein the body circles around to enable the slot section and the control section to overlap, the sliding member and the limiting member pass through the slot and the through hole for connection, and the slot section and the control section are sandwiched between the sliding member and the limiting member; and
an engaging member, passing through the slot with the control section for fixed connection, wherein the sliding member and the limiting member are configured to slide between a first end and a second end opposite to each other of the through hole, the first end is farther away from the engaging member fixedly connected to the control section than the second end,
when the sliding member and the limiting member are at the first end, the limiting member restricts an engaging end of the engaging member to be away from the engaging portion, such that the slot section and the control section are relatively slidable,
when the sliding member and the limiting member are at the second end, the limiting member releases restriction of the engaging end, such that the engaging end engages the engaging portion to restrict relative sliding between the slot section and the control section.

2. The adjustable strap as claimed in claim 1, wherein the engaging portion has a plurality of triangular teeth, and when the sliding member and the limiting member are located at the second end, a first inclined surface of each of the triangular teeth is configured to be propped against the engaging end, and a second inclined surface of each of the triangular teeth is closer to a tail end of the slot section than the first inclined surface.

3. The adjustable strap as claimed in claim 2, wherein included angles between the first inclined surfaces and the length direction are between 60 degrees and 80 degrees, and included angles between the second inclined surfaces and the length direction are between 10 degrees and 30 degrees.

4. The adjustable strap as claimed in claim 2, wherein included angles between the first inclined surfaces and the length direction are 75 degrees, and included angles between the second inclined surfaces and the length direction are 18 degrees.

5. The adjustable strap as claimed in claim 1, wherein the engaging portion is located at two lateral sides of the slot, and the engaging member has two engaging ends.

6. The adjustable strap as claimed in claim 1, further comprising a crossover connection member, crossing portions of the slot section located at two sides of the slot.

7. The adjustable strap as claimed in claim 1, wherein the control section has a stopping portion located next to one end of the slot away from a tail end of the slot section and configured to be in contact with a tail end of the control section to stop the control section.

8. A head mounted display device, comprising:
a display portion; and
an adjustable strap, connected to the display portion and comprising:
a body, two opposite sides of the body being a slot section and a control section, wherein the slot section has a slot and an engaging portion, the slot extends in a length direction of the slot section, the engaging portion is located at lateral sides of the slot, and the control section has a through hole;
a sliding member;
a limiting member, wherein the body circles around to enable the slot section and the control section to overlap, the sliding member and the limiting member pass through the slot and the through hole for connection, and the slot section and the control section are sandwiched between the sliding member and the limiting member; and
an engaging member, passing through the slot with the control section for fixed connection, wherein the sliding member and the limiting member are configured to slide between a first end and a second end opposite to each other of the through hole, the first end is farther away from the engaging member fixedly connected to the control section than the second end,
when the sliding member and the limiting member are at the first end, the limiting member restricts an engaging end of the engaging member to be away from the engaging portion, such that the slot section and the control section are relatively slidable,
when the sliding member and the limiting member are at the second end, the limiting member releases restriction of the engaging end, such that the engaging end engages the engaging portion to restrict relative sliding between the slot section and the control section.

9. The head mounted display device as claimed in claim 8, wherein the engaging portion has a plurality of triangular teeth, and when the sliding member and the limiting member are located at the second end, a first inclined surface of each of the triangular teeth is configured to be propped against the engaging end, and a second inclined surface of each of the triangular teeth is closer to a tail end of the slot section than the first inclined surface.

10. The head mounted display device as claimed in claim 9, wherein included angles between the first inclined surfaces and the length direction are between 60 degrees and 80 degrees, and included angles between the second inclined surfaces and the length direction are between 10 degrees and 30 degrees.

11. The head mounted display device as claimed in claim 9, wherein included angles between the first inclined surfaces and the length direction are 75 degrees, and included angles between the second inclined surfaces and the length direction are 18 degrees.

12. The head mounted display device as claimed in claim 8, wherein the engaging portion is located at two lateral sides of the slot, and the engaging member has two engaging ends.

13. The head mounted display device as claimed in claim 8, wherein the adjustable strap further comprises a crossover connection member, crossing portions of the slot section located at two sides of the slot.

14. The head mounted display device as claimed in claim 8, wherein the control section has a stopping portion located next to one end of the slot away from a tail end of the slot section and configured to be in contact with a tail end of the control section to stop the control section.

* * * * *